(12) United States Patent
Acikel et al.

(10) Patent No.: US 7,107,499 B1
(45) Date of Patent: Sep. 12, 2006

(54) SYSTEM AND METHOD FOR ADJUSTING A NON-RETURN TO ZERO DATA STREAM INPUT THRESHOLD

(75) Inventors: Omer Fatih Acikel, San Diego, CA (US); Warm Shaw Yuan, San Diego, CA (US); Daniel M. Castagnozzi, Lexington, MA (US)

(73) Assignee: Applied Micro Circuits Corporation, San Diego, CA (US)

( * ) Notice: Subject to any disclaimer, the term of this patent is extended or adjusted under 35 U.S.C. 154(b) by 1150 days.

(21) Appl. No.: 10/077,274

(22) Filed: Feb. 15, 2002

Related U.S. Application Data

(63) Continuation-in-part of application No. 10/020,426, filed on Dec. 7, 2001, now Pat. No. 7,024,599.

(51) Int. Cl.
*H03M 5/02* (2006.01)
*H04L 1/20* (2006.01)
*H03M 5/14* (2006.01)

(52) U.S. Cl. .................... 714/708; 341/68; 714/709
(58) Field of Classification Search ............... 714/708, 714/709; 360/41; 359/189; 341/68
See application file for complete search history.

(56) References Cited

U.S. PATENT DOCUMENTS

| | | | | |
|---|---|---|---|---|
| 5,057,946 A | * | 10/1991 | Sugiyama | 360/46 |
| 5,410,556 A | * | 4/1995 | Yeh et al. | 714/795 |
| 5,661,713 A | * | 8/1997 | Honma | 369/59.17 |
| 5,701,310 A | * | 12/1997 | Deguchi et al. | 714/746 |
| 5,920,534 A | * | 7/1999 | Furuta et al. | 369/59.18 |
| 6,188,737 B1 | | 2/2001 | Bruce et al. | 375/355 |
| 6,600,779 B1 | * | 7/2003 | Sawada et al. | 375/233 |
| 6,735,259 B1 | * | 5/2004 | Roberts et al. | 375/316 |
| 6,885,828 B1 | * | 4/2005 | Cornelius | 398/209 |

\* cited by examiner

*Primary Examiner*—Stephen M. Baker
(74) *Attorney, Agent, or Firm*—Law Office of Gerald Maliszewski; Gerald Maliszewski

(57) ABSTRACT

A state machine method and system are provided for determining non-causal channel equalization thresholds. The method comprises: receiving a non-return to zero (NRZ) data stream encoded with forward error correction (FEC); setting x=0; in State 0, adjusting a third threshold (Vopt) in response to corrected bit errors; if x=0, setting a first and second threshold equal to the third threshold; in State 1, if x=0, simultaneously adjusting the first threshold and the second threshold, to minimize the total number of corrected bit errors; in State 2, following State 0, adjusting the first threshold, independent of the second threshold, to minimize the total number of errors; in State 3, following State 0, adjusting the second threshold, independent of the first threshold, to minimize the total number of errors; and, adding 1 to x and returning to State 0.

29 Claims, 7 Drawing Sheets

Fig. 1 *(PRIOR ART)*
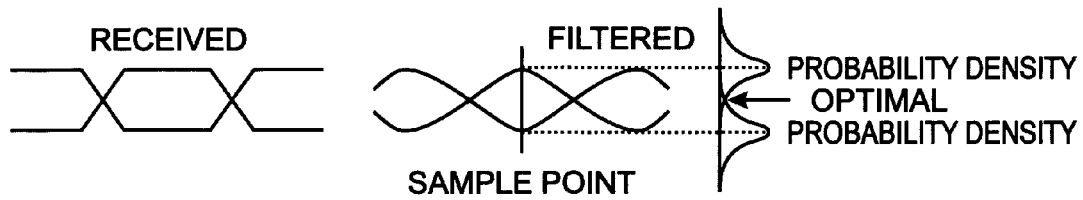
Fig. 2 *(PRIOR ART)*
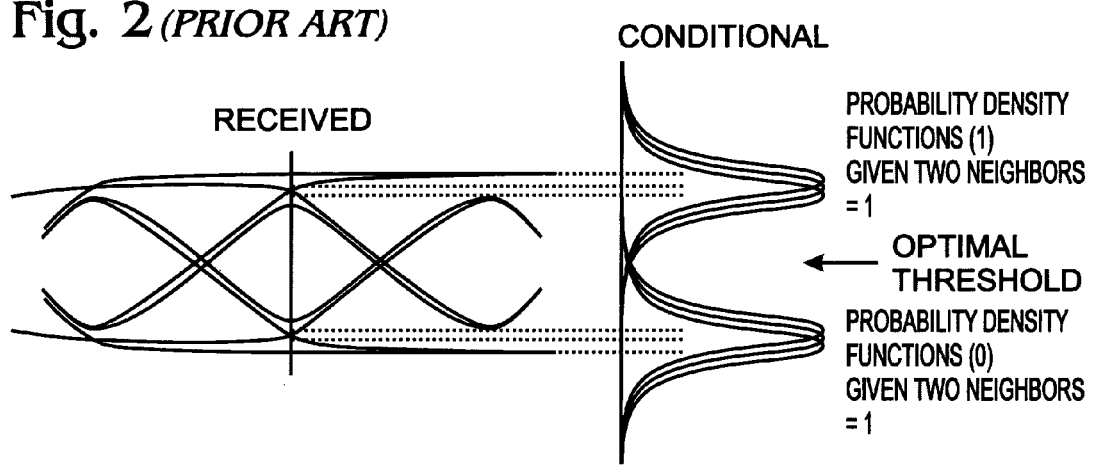
Fig. 3 *(PRIOR ART)*
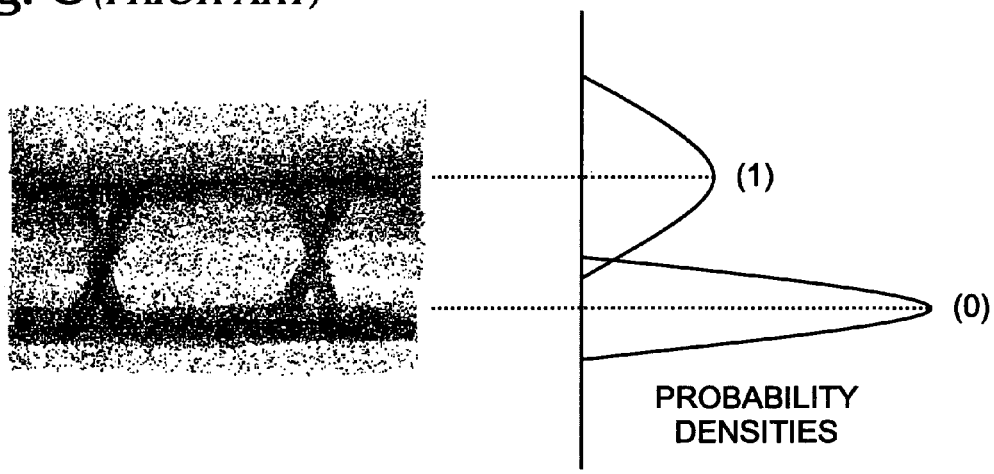

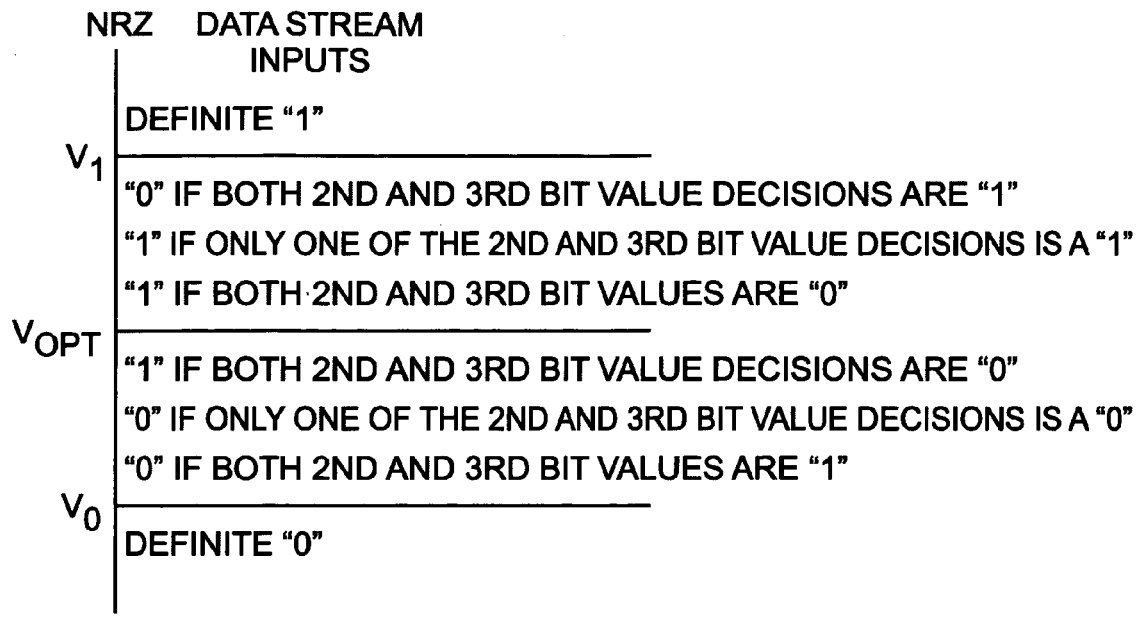

Fig. 5

NRZ DATA STREAM INPUTS $V_1$ | DEFINITE "1"

"0" IF BOTH 2ND AND 3RD BIT VALUE DECISIONS ARE "1"
"1" IF ONLY ONE OF THE 2ND AND 3RD BIT VALUE DECISIONS IS A "1"
"1" IF BOTH 2ND AND 3RD BIT VALUES ARE "0"

$V_{OPT}$

"1" IF BOTH 2ND AND 3RD BIT VALUE DECISIONS ARE "0"
"0" IF ONLY ONE OF THE 2ND AND 3RD BIT VALUE DECISIONS IS A "0"
"0" IF BOTH 2ND AND 3RD BIT VALUES ARE "1"

$V_0$ | DEFINITE "0"

Fig. 8

| FIRST BIT ESTIMATE LINE 120A | 120B | 2ND BIT VALUE | 3RD BIT VALUE | 1ST BIT VALUE |
|---|---|---|---|---|
| 0 | 0 | 0 | 0 | 0 |
| 0 | 0 | 0 | 1 | 0 |
| 0 | 0 | 1 | 0 | 0 |
| 0 | 0 | 1 | 1 | 0 |
| 0 | 1 | 0 | 0 | 1 |
| 0 | 1 | 0 | 1 | 0 |
| 0 | 1 | 1 | 0 | 0 |
| 0 | 1 | 1 | 1 | 0 |
| 1 | 0 | 0 | 0 | 1 |
| 1 | 0 | 0 | 1 | 1 |
| 1 | 0 | 1 | 0 | 1 |
| 1 | 0 | 1 | 1 | 0 |
| 1 | 1 | 0 | 0 | 1 |
| 1 | 1 | 0 | 1 | 1 |
| 1 | 1 | 1 | 0 | 1 |
| 1 | 1 | 1 | 1 | 1 |

SYSTEM AND METHOD FOR ADJUSTING A NON-RETURN TO ZERO DATA STREAM INPUT THRESHOLD

RELATED APPLICATIONS

This application is a continuation-in-part of a application entitled, SYSTEM AND METHOD FOR NON-CASUAL CHANNEL EQUALIZATION, invented by Castagnozzi et al., Ser. No. 10/020,426, filed Dec. 7, 2001, now U.S. Pat. No. 7,024,599.

This application is related to a pending application entitled, SYSTEM AND METHOD FOR NON-CASUAL CHANNEL EQUALIZATION IN AN ASYMMETRICAL NOISE ENVIRONMENT, invented by Yuan et al., Serial No. 10/066,966, filed Feb. 4, 2002.

BACKGROUND OF THE INVENTION

1. Field of the Invention

This invention generally relates to digital communications and, more particularly, to systems and methods for minimizing the effects of inter-symbol interference in a non-return to zero (NRZ) data channel by sequentially establishing a plurality of bit decision thresholds in a non-casual decision circuit.

2. Description of the Related Art

FIG. 1 is a diagram illustrating a signal recovered from a binary symmetric, non-dispersive channel in the presence of symmetric noise (prior art). Conventionally, the signal is filtered with a transfer function matched to the signaling waveform (in this case a one unit step) and thresholded at the voltage level most likely to yield the transmitted bit. To recover the transmitted information, a hard decision must be made as to the value of the received bit.

As a function of the filtering process, and sometimes as a result of the transmission process, pulse spreading occurs. That is, the energy associated with a bit spreads to neighboring bits. For small degrees of spreading these effects of this can be limited to the nearest neighbors with modest degradation in performance.

Three basic types of pulse spreading exist. The first possibility is that both the neighboring bits are a zero (no neighboring bits are a one). The second possibility is that only one of the neighboring bits (either the preceding or subsequent bit) is a one. Alternately stated, only one of the neighboring bits is a zero. The third possibility is that both neighboring bits are one. For each of these cases the likelihood of error in determining a bit value can be minimized if a different thresholds are used for different bit combinations.

FIG. 2 is a diagram illustrating received waveforms that are distorted in response to the inter-symbol interference resulting from energy dispersion (prior art). The value at the output of the filter varies with each bit, and is essentially a random process, due to the non-deterministic nature of the information, and pseudorandom scrambling that is often used in the transmission of NRZ data streams. However, received bits can be characterized with probability density functions, as shown. Without knowledge of the neighboring bits, a single probability density function can be extracted that represents the random behavior of the input over all conditions and all sequences. However, conditional probability density functions can be defined for the three cases mentioned above. Namely, probability density functions can be defined for the cases where there are zero neighboring ones, only one neighboring one, and two neighboring ones.

If the bit value decision process could be made using the knowledge of the decision made on the preceding decoded bit, and with a measurement of a subsequent decoded bit, then the corresponding probability density function could be selected to make a more accurate decision on the current bit decision. However, the cost and accuracy of conventional analog-to-digital (A/D) conversion circuits make such a solution impractical.

The degree of dispersion exhibited by a channel, and hence the separation of the conditional probability density functions, varies in response to a number of fixed and variable factors. Effective dispersion mitigation techniques must therefore be easily optimized to the channel and somewhat adaptive to changes in the channel due to aging, temperature changes, reconfiguration, and other possible influences.

The above-mentioned problems, in separating the conditional probability density functions of the three bit sequence scenarios, are exasperated when the noise distribution is not symmetric. That is, the energy distributions for "1" bits and "0" bits are different.

FIG. 3 is a diagram illustrating a signal recovered from a binary symmetric, non-dispersive channel in the presence of asymmetric noise (prior art). There are differences in the shapes of the "1" and "0" probability density functions. Because of the overlap of the two functions, the values of thresholds are not necessarily the same as the values of the thresholds established for the symmetrical noise distribution case in FIG. 1.

It would be advantageous if inter-symbol interference (ISI) caused by energy dispersion in a received NRZ data channel could be minimized.

It would be advantageous if the bit decision thresholds could be modified to take account of the dispersed energy in the neighboring bits in the NRZ data stream.

It would be advantageous if the above-mentioned inter-symbol interference modifications could also take into account the effects of an asymmetric noise distribution.

It would be advantageous if the above-mentioned ISI modifications could be performed in a simple, non-computationally intensive manner.

SUMMARY OF THE INVENTION

Many communication channels exhibit temporal spreading of the signaling waveform when propagating over long distances or over non-linear media. This phenomenon is not effectively addressed by traditional linear equalization techniques due to the non-casual nature of the impairment. A method is presented to reduce the effects of pulse spreading on hard-decision error rate in communication systems affected by this problem. The method utilizes multiple decision thresholds for each data bit. Post-processing of the multiple decision data is employed to reduce the data to a single hard decision per bit. The multiple data thresholds are adjusted for optimal mitigation of the spreading effect.

The proposed approach to this problem is to perform multiple decisions on every bit with a threshold for each of the above-mentioned conditional probability density functions. The multiple decision data is stored for several bit times, to allow a calculation to be made on the succeeding bits. This calculation is then used to select the threshold most appropriate given the estimated neighbor values. The refined decision is output from the device and fed-forward to be used in processing of subsequent bits. A further analysis is also performed of the bit errors corrected by forward error correction (FEC) decoding. Each threshold is sequentially adjusted, in a computationally parsimonious manner, in response to the bit error analysis.

Accordingly, a communications receiver state machine method is provided for determining non-casual channel equalization thresholds. The method comprises: receiving a non-return to zero (NRZ) data stream encoded with forward error correction (FEC); setting x=0; in State 0, adjusting a third threshold (Vopt) in response to corrected bit errors; if x=0, setting a first and second threshold equal to the third threshold; in State 1, if x=0, simultaneously adjusting the first threshold, for distinguishing a high probability "1" bit estimate and the second threshold, for distinguishing a high probability "0" bit estimate, to minimize the total number of corrected bit errors; in State 2, following State 0, adjusting the first threshold, independent of the second threshold, to minimize the total number of errors; in State 3, following State 0, adjusting the second threshold, independent of the first threshold, to minimize the total number of errors; and, adding 1 to x and returning to State 0.

In State 1, simultaneously adjusting the first threshold and the second threshold includes adjusting the first and second thresholds an equal increment from the third threshold, in opposite directions.

In State 0, the third threshold (Vopt) is adjusted in response to either minimizing the total number of corrected bit errors or balancing the number of corrected "1" bit and "0" bit errors. If x≠0, adjustments are made to the first and second threshold equal to adjustments made to the third threshold.

Additional details of the above-described method, and a system for determining non-casual channel equalization thresholds are provided below.

BRIEF DESCRIPTION OF THE DRAWINGS

FIG. 1 is a diagram illustrating a signal recovered from a binary symmetric, non-dispersive channel in the presence of symmetric noise (prior art).

FIG. 2 is a diagram illustrating received waveforms that are distorted in response to the inter-symbol interference resulting from energy dispersion (prior art).

FIG. 3 is a diagram illustrating a signal recovered from a binary symmetric, non-dispersive channel in the presence of asymmetric noise (prior art).

FIG. 5 is a graph illustrating the thresholds established by the multi-threshold circuit.

FIGS. 7 and 8 are a schematic block diagram and associated truth table of the non-casual circuit of FIG. 4.

DETAILED DESCRIPTION OF THE PREFERRED EMBODIMENTS

Figure 4:
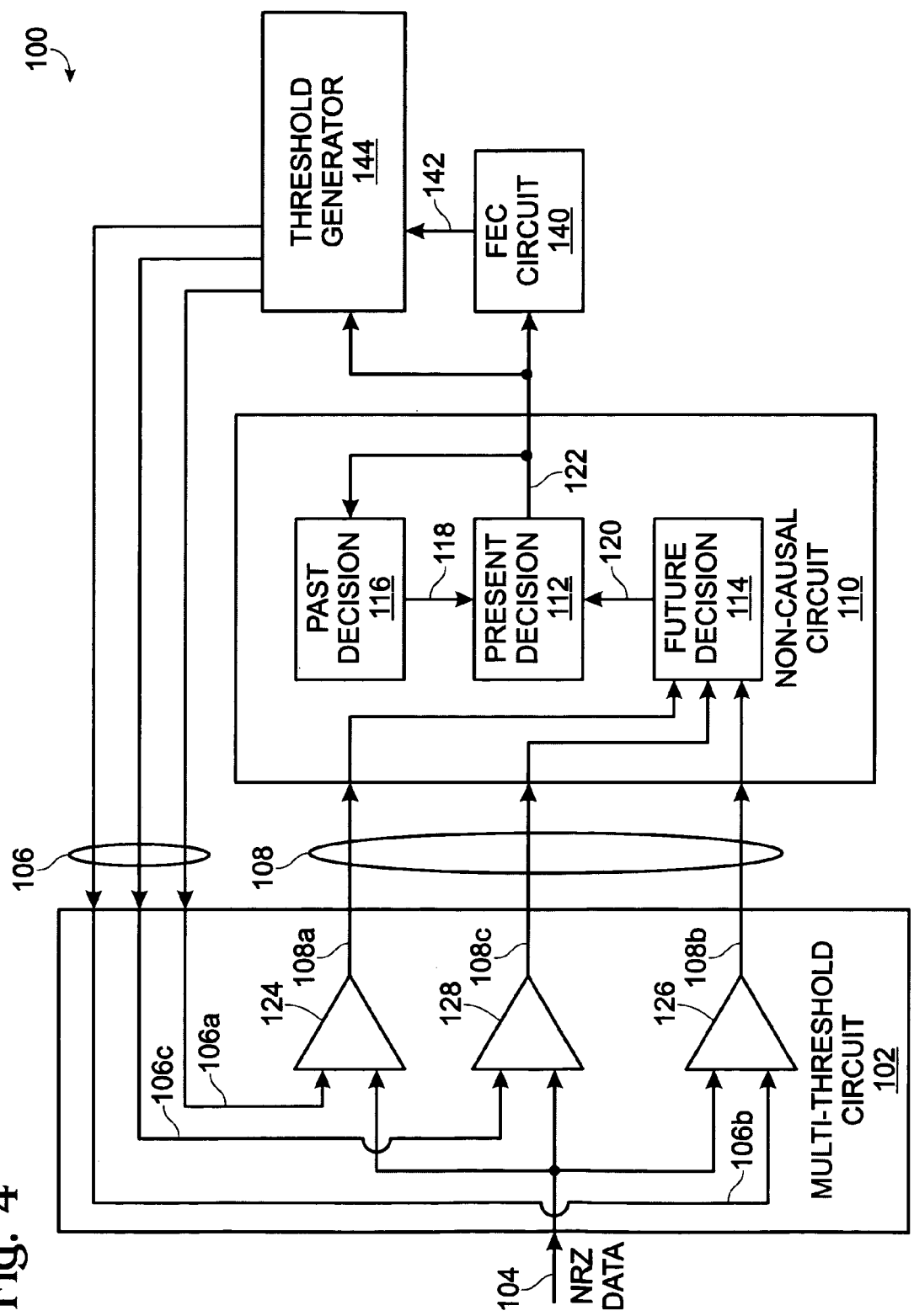
FIG. 4 is a schematic block diagram of the present invention system for determining non-casual channel equalization thresholds in a communication system.

FIG. 4 is a schematic block diagram of the present invention system for determining non-casual channel equalization thresholds in a communication system. The system 100 comprises a multi-threshold decision circuit 102 having an input on line 104 to accept a non-return to zero (NRZ) data stream, and an input on line 106 to accept threshold values. The multi-threshold decision circuit 102 has outputs on line 108 to provide bit estimates responsive to a plurality of voltage threshold levels. A non-casual circuit 110 has inputs on line 108 to accept the bit estimates from the multi-threshold decision circuit 102. The non-casual circuit 110 compares a current bit estimate (a first bit) to bit values decisions made across a plurality of clock cycles. The non-casual circuit 110 has an output to supply a bit value decision for the current bit estimate determined in response to the non-casual bit value comparisons.

The non-casual circuit 110 includes a present decision circuit 112, a future decision circuit 114, and a past decision circuit 116. The future decision circuit has inputs connected to the mutli-threshold circuit outputs on line 108. The future decision circuit 114 has outputs to supply the first bit estimate and the third bit value (as explained below). The present decision circuit 112 has inputs to accept the first bit estimate, the third bit value, and a second bit value from the past decision circuit 116. The present decision circuit 112 compares the first bit estimate in the data stream to the second bit value received prior to the first bit estimate, represented as being supplied from the past decision circuit 116 on line 118. The present decision circuit 112 also compares the first bit estimate to the third bit value received subsequent to the first bit estimate, represented as being from the future decision circuit 114 on line 120. The present decision circuit 112 has an output on line 122 to supply a first bit value determined in response to comparing the first bit estimates to the second and third bit values.

FIG. 5 is a graph illustrating the thresholds established by the multi-threshold circuit. The following discussion should be considered in light of both FIGS. 4 and 5. The multi-threshold circuit 102 includes a first comparator 124 having an input to accept the NRZ data stream on line 104, an input connected on line 106a to establish a first threshold (V1), and an output on line 108a to supply a signal distinguishing when the NRZ data stream input has a high probability of being a "1" bit value. A second comparator 126 has an input on line 104 to accept the NRZ data stream, an input on line 106b to establish a second threshold (V0), and an output on line 108b to supply a signal distinguishing when NRZ data stream input has a high probability of being a "0" bit value. More literally, the second comparator 126 supplies a "0" when the NRZ data stream input on line 104 has a high probability of being a "0".

A third comparator 128 has an input on line 104 to accept the NRZ data stream, an input on line 106c to establish a third threshold (Vopt), and an output on line 108c to provide a signal when the NRZ data stream input has an approximately equal probability of being a "0" value as a "1" value. Distinguishing between a "1" and a "0" is a process that is performed by the non-casual circuit 110.

A forward error correction (FEC) circuit 140 has an input to receive determined first bit values on line 122 from the non-casual circuit 110. The FEC circuit 140 decodes the incoming data stream and corrects bit values in response to the decoding, as is well known in the art. The FEC circuit 140 has an output on line 142 to supply a stream of corrected data bits.

A threshold generator 144 has an input on line 122 to receive the determined first bit values from the non-casual circuit 110 and an input to receive corrected data bits from the FEC circuit 140 on line 142. The threshold generator 144 has outputs on line 106a through 106c to sequentially supply the threshold values to the multi-threshold circuit 102 in response to analyzing the corrected bit errors.

When the multi-threshold circuit 102 receives a NRZ data stream input below the third threshold (Vopt) and above the second threshold (V0), the present decision circuit (of the non-casual circuit 110) responds by supplying a (first) bit value of "1" on line 122, if both the second and third bit values are "0" on lines 118 and line 120, respectively. Otherwise, the present decision circuit 112 supplies a bit value of "0", if only one of the second and third bit values is a "0", or if both the second and third bit values are a "1". When the multi-threshold circuit 102 receives a NRZ data stream input above the third threshold and below the first threshold, the present decision circuit 112 responds by supplying a bit value decision of "0" if both the second and third bit values are "1". The present decision circuit 112 supplies a bit value decision of "1" if only one of the second and third bits is a "1" value, or if both the second and third bit values are a "0".

Figure 6A:
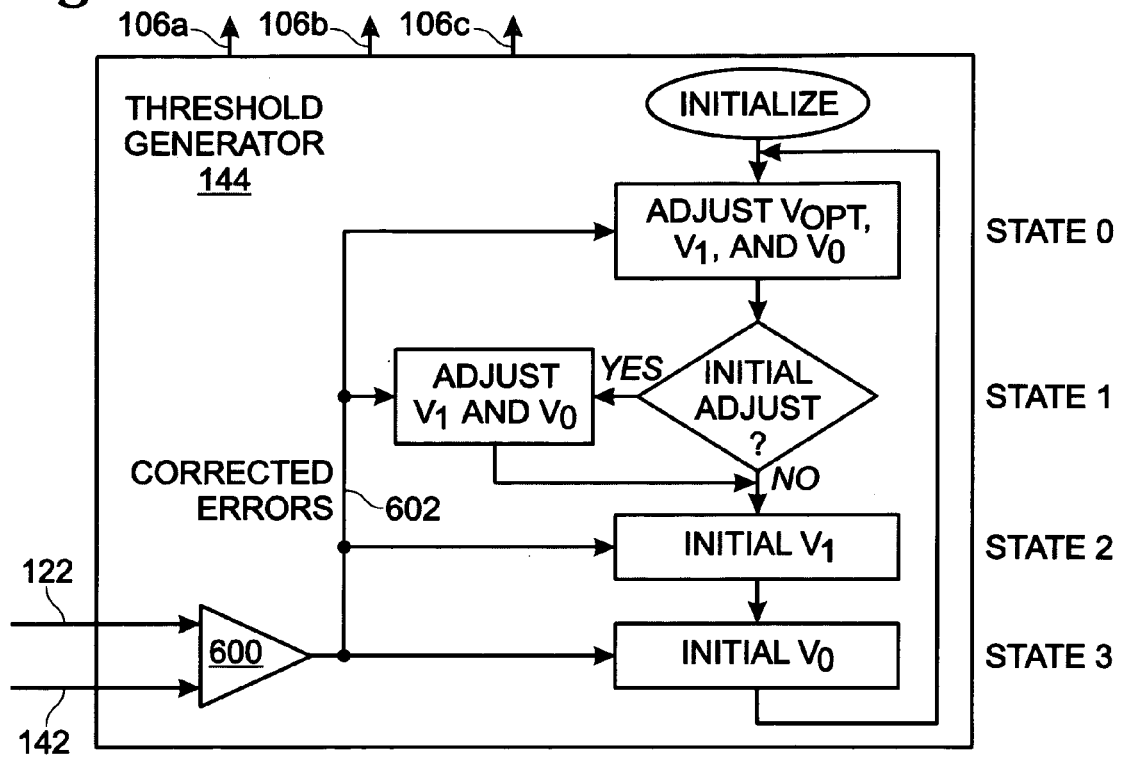
FIGS. 6a and 6b are diagrams illustrating the operation of the threshold generator of FIG. 4.
Figure 6B:
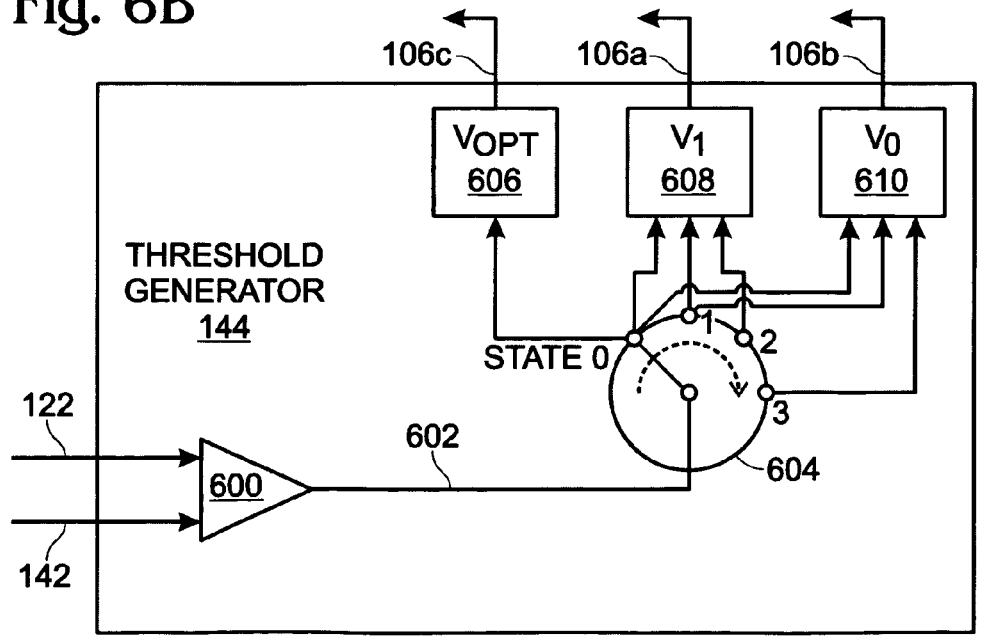

FIGS. 6a and 6b are diagrams illustrating the operation of the threshold generator 144 of FIG. 4. For clarity, the operation of the threshold generator 144 is represented as a state machine in FIG. 6a. The state machine can be enabled in either hardware or software. The threshold generator 144 accepts the first bit determinations on line 122 and the FEC corrected bit data stream on line 142. Comparator 600 represents an analysis of the corrected bits. The corrected bit analysis on line 602 can be the total number of bit errors, the number of corrected "1" bit errors, the number of corrected "0" bit errors, or combinations of the above.

The threshold generator 144 initially sets the third threshold to balance to the number of "1" bit and "0" bit errors (State 0). Alternately, the threshold generator 144 initially sets the third threshold to minimize the total number of bit errors. The threshold generator 144 adjusts the first and second thresholds as follows. The threshold generator 144 initially sets the first and second thresholds equal to the third threshold in State 0 (after initialization). The threshold generator 144 then makes an initial simultaneous adjustment to the first and second thresholds to minimize the total number of bit errors (State 1). The threshold generator 144 makes an initial simultaneous adjustment to the first and second thresholds in State 1 by adjusting the first and second thresholds an equal increment from the third threshold, in opposite directions. Note that the thresholds represent voltage levels. The V1 threshold is set above Vopt, and the V0 threshold is set below Vopt.

Following the initial simultaneous adjustment of the first and second thresholds in State 1, the threshold generator 144 adjusts the first threshold, independent of the second threshold, to minimize the total number of corrected bit errors (State 2). Then, the threshold generator 144 adjusts the second threshold, independent of the first threshold, to minimize the total number of corrected bit errors (State 3). Note that the order of States 2 and 3 is arbitrary. In other aspects of the system State 3 can occur before State 2, or the order of States 2 and 3 can be varied.

The threshold generator 144 iteratively repeats the sequential adjustments of the first, second, and third thresholds. As shown, after State 3 the operation returns to State 0. Note that State 1 occurs only one time, after initialization. The threshold generator 144 iteratively adjusts the third threshold as follows. As with the initial setting of the Vopt level, the third threshold is responsive to either balancing the number of "1" bit and "0" bit corrected errors, or minimizing the total number of bit errors. Equal adjustments are made to the first and second thresholds in State 0. For example, if Vopt is adjusted +0.5 volts in the second iteration of State 0, the V1 and V0 levels are likewise adjusted +0.5 volts.

In FIG. 6b the operation of the state machine is represented by a rotary switch 604 that selectively relays corrected bit error information from the comparator 600 to the Vopt (third threshold) generator 606, the V1 (first threshold) generator 608, and the V0 (second threshold) generator 610. As shown, all three generators 606–610 receive the error information in the first switch position (State 0). Generators 608 and 610 are connected in the next switch position (State 1). The V1 generator 608 is connected in the next switch position (State 2), and the V0 generator 610 is connected in the last switch position (State 3).

Returning to FIG. 4, the multi-threshold circuit 102 receives a non-return to zero (NRZ) data stream with data organized in frames. Data is framed in the digital wrapper (DW) and synchronous optical network (SONET) protocols. However, the present invention system is not limited to any particular manner of identifying data groups. The threshold generator 144 summarizes corrected bit errors for each frame and sequentially adjusts the first, second, and third thresholds in response to the corrected bit errors as follows. The third threshold is adjusted in response to corrected bit errors for a first set of frames (State 0). As noted above, the first and second thresholds are adjusted in lockstep with the third threshold, after the initial occurrence. The first threshold is adjusted (State 2) in response to corrected bit errors for a second set of frames, subsequent to the first set of frames. The second threshold is adjusted (State 3) in response to corrected bit errors for a third set of frames, subsequent to the first set of frames. As noted above, the order of States 2 and 3 is arbitrary. The sets of frames can be as small as a single frame, but are typically hundreds of frames. A large sample of frames helps insure that the thresholds are not being set in abnormal conditions.

Figure 7:
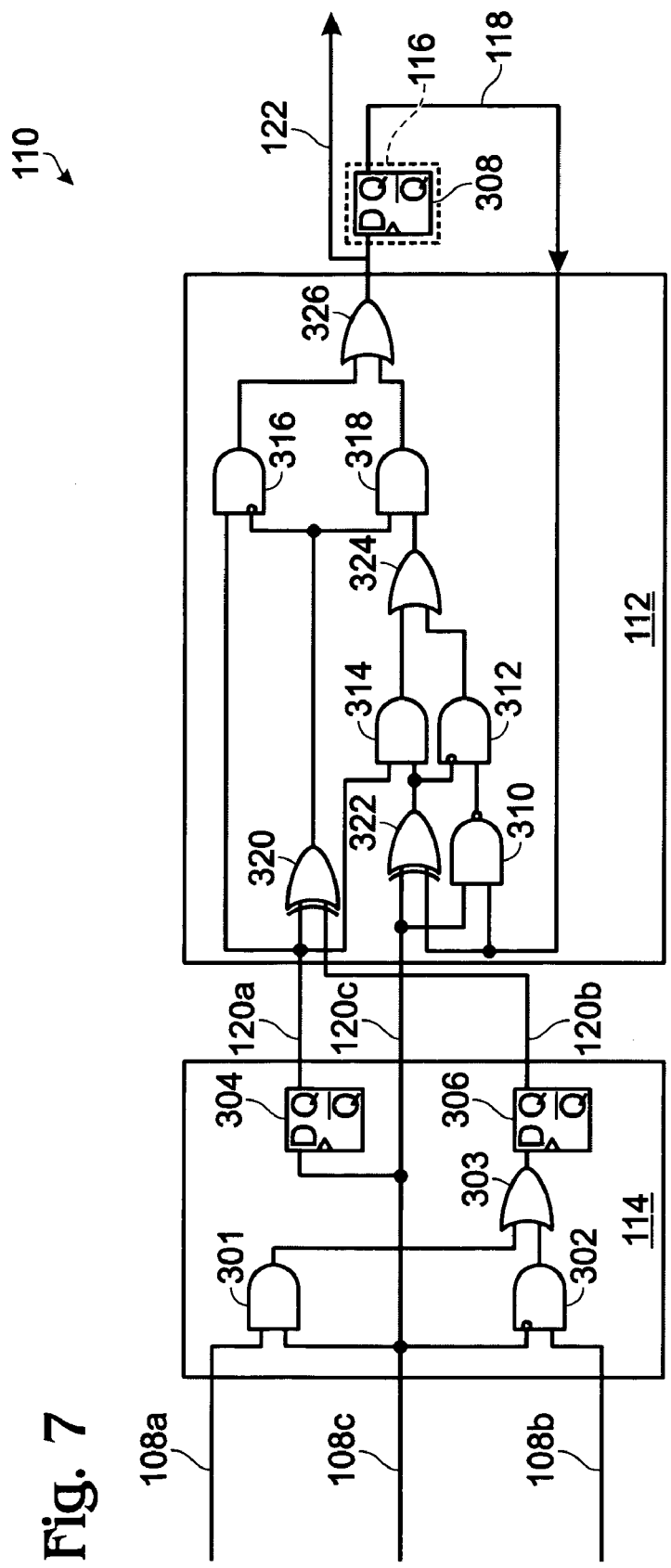

FIGS. 7 and 8 are a schematic block diagram and associated truth table of the non-casual circuit 110 of FIG. 4. FIG. 7 represents only one of many designs that can be used to embody the invention. The future decision circuit 114 has inputs connected to the outputs of the first, second, and third comparators of the multi-threshold circuit on lines 108a, 108b, and 108c, respectively. These three lines correspond to the thresholds shown in FIG. 5. The future decision circuit 114 passes the third comparator signal through on line 120c. This signal is called the third bit value. The future decision circuit 114 performs AND and OR operations using AND circuit 301, AND circuit 302, and OR circuit 303. Delays of one clock cycle are added using flip-flops 304 and 306. When the NRZ data stream input is less than V0, the estimates on line 120a and 120b are "0,0", respectively. When the NRZ data stream input is between Vopt and V0, the estimates on lines 120a and 120b are "0,1", respectively. When the NRZ data stream input is between Vopt and V1, the estimates on lines 120a and 120b are "1,0", respectively. When the NRZ data stream input is above V1, the estimates are lines 120a and 120b are "1,1", respectively. The combination of lines 120a and 120b is called the first bit estimate.

The past decision circuit 116 delays the first bit value on line 122 one clock cycle to supply the second bit value on line 118. Again, a D flip-flop 308 is used for the delay.

The present decision circuit 112 has inputs connected to the future decision circuit outputs to accept the first bit estimate and third bit value on lines 120a, 120b, and 120c, respectively. The present decision circuit 112 supplies a first bit value by comparing the first bit estimate to situations when the second and third bit decision values are both "1", when the second and third bit value decisions are both "0", and when only one of the second and third bit value decisions is a "1". To accomplish these above-stated goals, AND circuits 310 through 318 are employed. Note that AND circuits 316 and 318 have one inverted input and that 310 has an inverted output (NAND). Also used are OR and XOR gates 320 through 326. Again, alternate circuit designs can accomplish the same functions. More important is the relationship between the signal inputs and signal outputs.

FIG. 8 is a truth table illustrating the operation of the present decision circuit 112 of FIG. 7. The non-casual circuit can be implemented using many different combinations of circuits. More critical is the actual task performed. This task is more clearly defined in light of the truth table diagram.

The first four lines in the table illustrate the case where the NRZ data input, at a clock period associated with a first bit, is below V0. The first bit value is made in comparison to the four different combinations of the second and third bit values. Likewise, the second four lines in the table illustrate the case where the NRZ data input, at a clock period associated with a first bit, is above V0 and below Vopt. The third set of four lines in the table illustrates the case where the NRZ data input is above Vopt, but below V1. The last set of four lines in the table illustrates the case where the NRZ data input is above V1.

The first, second, and third thresholds are adjusted to minimize the number of errors being output by the present decision circuit on line 122. Because the NRZ input is pseudorandomly scrambled, the present decision circuit supplies approximately an equal number of "0" and "1" first bit values in response to establishing the first, second, and third thresholds. However, the multi-threshold circuit output need not necessarily supply, nor the present decision circuit input need not necessarily accept an equal number of "0" and "1" bit estimates for this result to occur. The thresholding of the NRZ data input in an asymmetrical noise environment may result in a bias in the ratio between "1s" and "0s". In some aspects of the system, the present decision circuit operates to eliminate this bias.

FUNCTIONAL DESCRIPTION

Returning to FIG. 4, in some aspects of the system 100, the communications are received in a modulation format different than NRZ, and then converted to NRZ format. The NRZ input signal can also be buffered (not shown). The NRZ data signal is provided to the multiple threshold comparators 124 through 126. In some aspects of the system 100 circuits, not shown, a timing recovery circuit is used at the output of the comparators on lines 108a through 108c. The timing recovery circuit generates a clock and sample signal from the received data. The sample signal is synchronized to the center of the data bit. The sample point can be offset to compensate device or channel specific anomalies.

Figure 9:
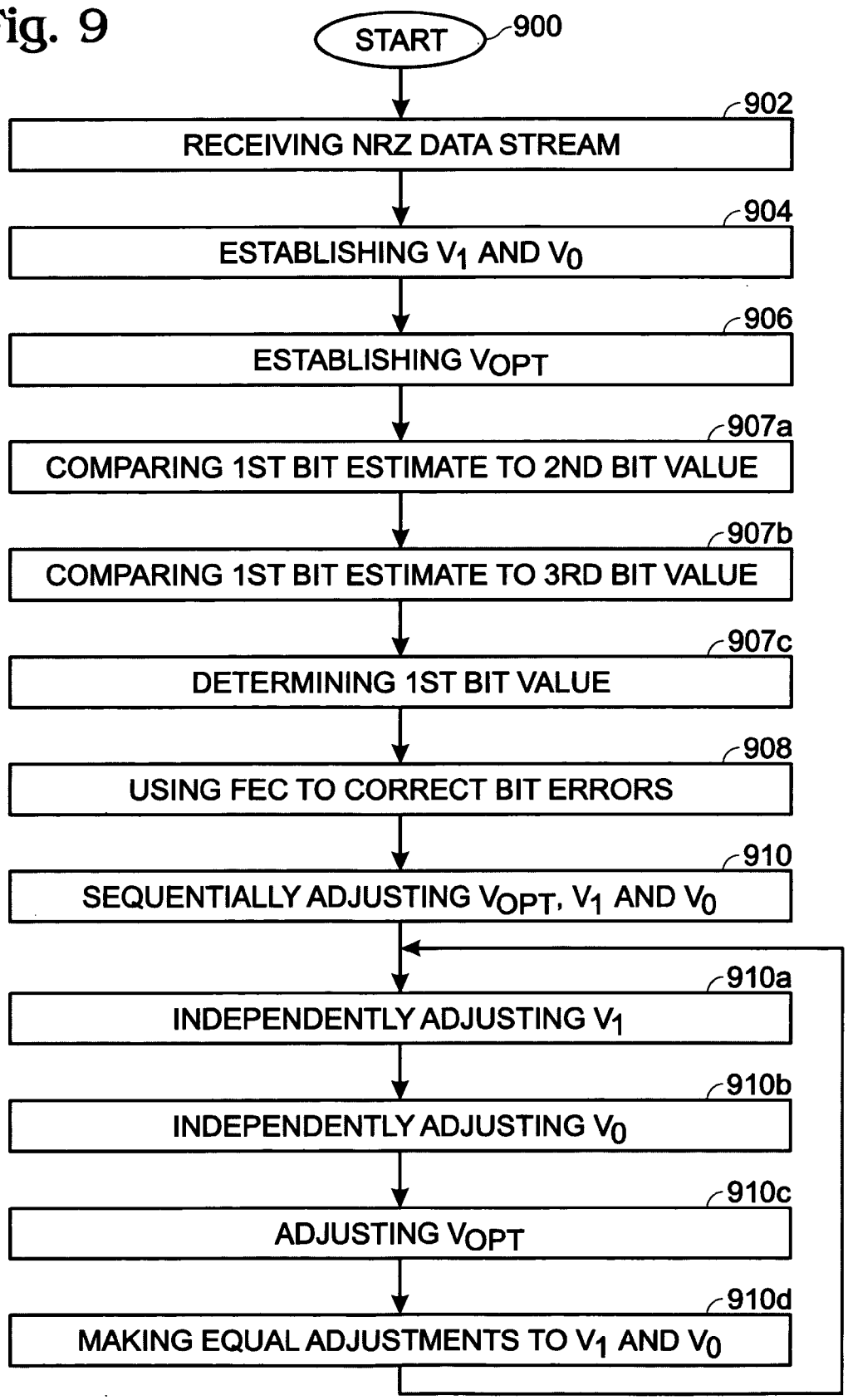
FIG. 9 is a flowchart illustrating the present invention method for determining non-casual channel equalization thresholds in a communication system.

FIG. 9 is a flowchart illustrating the present invention method for determining non-casual channel equalization thresholds in a communication system. These methods generally correspond to FIGS. 4 and 6. Although this method (and the method of FIG. 10 below) is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 900. Step 902 receives a non-return to zero (NRZ) data stream input. Step 904 establishes a first threshold (V1) to distinguish a high probability "1" bit estimate, and a second threshold (V0) to distinguish a high probability "0" bit estimate. Step 906 establishes a third threshold (Vopt) to estimate bit values having approximately an equal probability of being a "1" and a "0" bit value. Step 908 uses forward error correction (FEC) decoding to correct the bit errors. Step 910 sequentially adjusts the first, second, and third thresholds in response to the corrected bit errors. Note, Step 904 need not necessarily occur before Step 906.

In one aspect of the method, establishing the third threshold in Step 906 (State 0) includes initially setting the third threshold to balance to the number of "1" bit and "0" bit errors. Alternately, establishing the third threshold includes initially setting the third threshold to minimize the total number of bit errors.

Establishing the first and second thresholds in Step 904 includes substeps. Step 904a (not shown) initially sets the first and second thresholds equal to the third threshold (State 0, initial occurrence). Step 904b (not shown) makes an initial simultaneous adjustment to the first and second thresholds to minimize the total number of bit errors (State 1). In some aspects, simultaneously making an initial adjustment to the first and second thresholds includes adjusting the first and second thresholds an equal increment from the third threshold, in opposite directions.

Step 910a, following the initial simultaneous adjustment of the first and second thresholds, adjusts the first threshold, independent of the second threshold, to minimize the total number of corrected bit errors. Step 910b, following the initial simultaneous adjustment of the first and second thresholds, adjusts the second threshold, independent of the first threshold, to minimize the total number of corrected bit errors. Note, Step 910a may occur after Step 910b in some aspects of the method.

In some aspects, sequentially adjusting the first, second, and third thresholds in response to the corrected bit errors in Step 910 includes iteratively repeating the sequential adjustments of the first, second, and third thresholds.

Iteratively adjusting the third threshold in Step 910 includes other substeps. Step 910c adjusts the third threshold in response to either balancing the number of "1" bit and "0" bit corrected errors or minimizing the total number of bit errors. Step 910d makes equal adjustments to the first and second thresholds. These steps are State 0 (See FIG. 6) after the initial occurrence.

Step 907a compares a first bit estimate in the data stream to a second bit value received prior to the first bit. Step 907b compares the first bit estimate to a third bit value received subsequent to the first bit. Step 907c, in response to the comparisons, determines the value of the first bit.

Establishing first and third thresholds in Step 906 and 904 includes distinguishing NRZ data stream inputs below first threshold and above the third threshold as a "0" if both the second and third bits are "1" values, as a "1" if only one of the second and third bits is a "1" value, and as "1" if both the second and third bits are a "0" value. Establishing the second and third thresholds in Step 906 and 904 includes distinguishing NRZ data stream inputs above the second threshold and below the third threshold as a "1" if both the second and third bits are a "0" value, as a "0" if only one of the second and third values is a "0" value, and as a "0" if both the second and third bits are a "1" value.

In some aspects of the method, receiving a non-return to zero (NRZ) data stream input in Step 902 includes receiving NRZ data organized in frames. Using forward error correction (FEC) decoding to correct the bit errors in Step 908 includes summarizing corrected bit errors for each frame. Then, iteratively repeating the sequential adjustments of the first, second, and third thresholds in response to the corrected bit errors in Step 910 includes:

simultaneously adjusting the first, second, and third thresholds in response to corrected bit errors for a first set of frames (State 0);

independently adjusting the first threshold in response to corrected bit errors for a second set of frames, subsequent to the first set of frames (State 2); and, independently adjusting the second threshold in response to corrected bit errors for a third set of frames, subsequent to the first set of frames (State 3).

Figure 10:
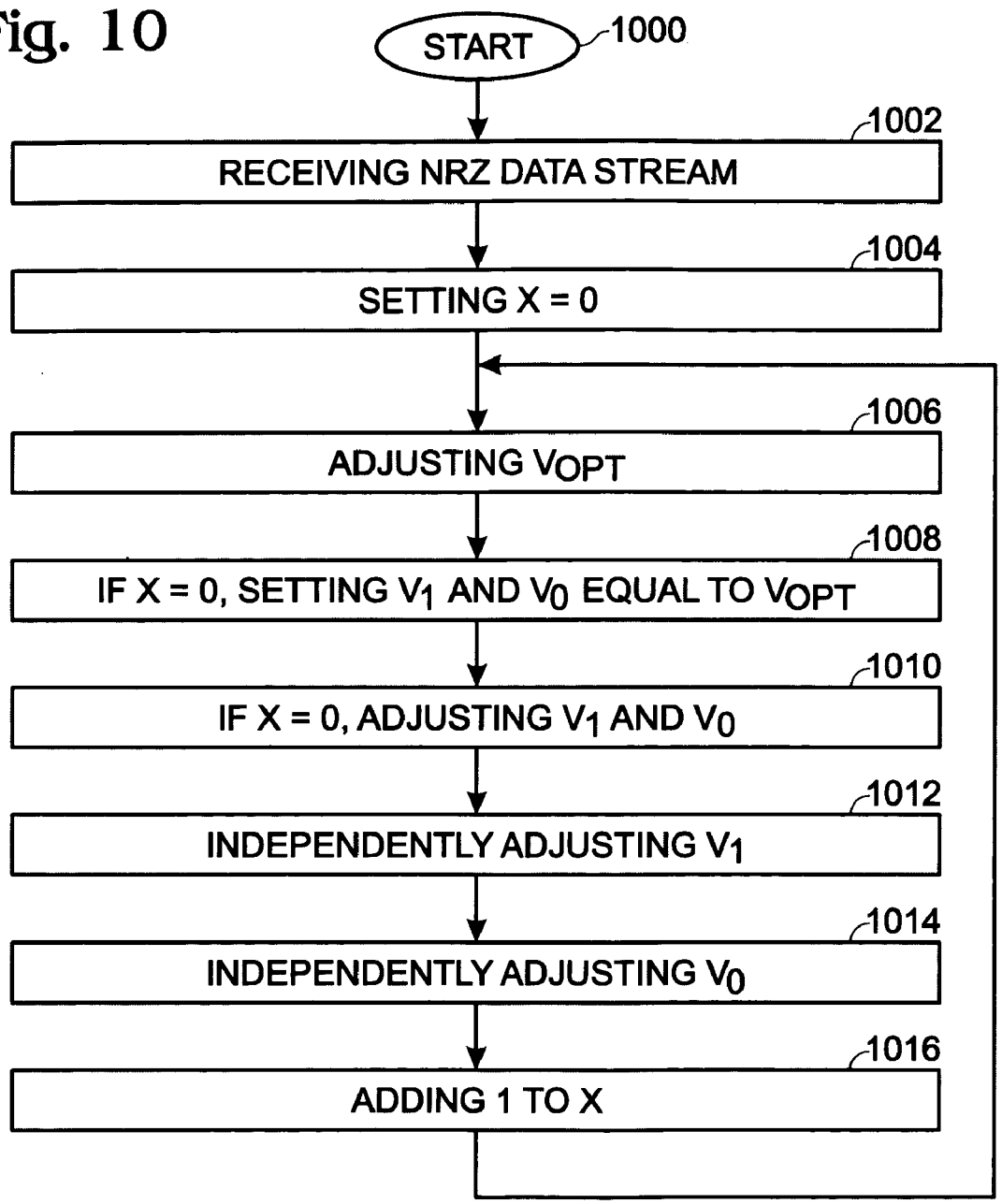
FIG. 10 is a flowchart illustrating a communications receiver state machine method for determining non-casual channel equalization thresholds.

FIG. 10 is a flowchart illustrating a communications receiver state machine method for determining non-casual channel equalization thresholds. The method starts at Step 1000. Step 1002 receives a non-return to zero (NRZ) data stream encoded with forward error correction (FEC). Step 1004 sets x=0. Step 1006, in State 0, adjusts a third threshold (Vopt) in response to corrected bit errors. Step 1008, if x=0, sets a first and second threshold equal to the third threshold. Step 1010, in State 1, if x=0, simultaneously adjusts the first threshold, for distinguishing a high probability "1" bit estimate and the second threshold, for distinguishing a high probability "0" bit estimate, to minimize the total number of corrected bit errors. Step 1012, in State 2, following State 0, adjusts the first threshold, independent of the second threshold, to minimize the total number of errors. Step 1014, in State 3, following State 0, adjusts the second threshold, independent of the first threshold, to minimize the total number of errors. Step 1016 adds 1 to x and returns to State 0 (Step 1006). As mentioned above, the order of Steps 1012 and 1014 is arbitrary.

In some aspects of the method, Step 1006 (State 0) includes setting a third threshold (Vopt) in response to either minimizing the total number of corrected bit errors or balancing the number of corrected "1" bit and "0" bit errors. In some aspects, Step 1010 (State 1) includes simultaneously adjusting the first threshold and the second threshold an equal increment from the third threshold, in opposite directions.

In some aspects, Step 1006 (State 0) further includes, if x≠0, making adjustments to the first and second threshold equal to adjustments made to the third threshold.

A system and method has been provided for sequentially adjusting thresholds in a non-casual communication system. Examples have been given of an NRZ modulation protocol, however, the principles of the present invention can be applied to other protocols where ISI is an issue. Examples have also been given of a three-threshold decision system. Once again, the principles of the present invention can be applied to systems using a different number of decision thresholds. Also, examples of the three-bit (future/present/past) non-casual decision circuit have been given. The present invention could also be applicable to a non-casual circuit that evaluates longer sequences of bit decision. Other variations and embodiments of the invention will occur to those skilled in the art.

We claim:

1. In a communications system, a method for determining non-causal channel equalization thresholds, the method comprising:

receiving a non-return to zero (NRZ) data stream input;

establishing a first threshold (V1) to distinguish a high probability "1" bit estimate, and a second threshold (V0) to distinguish a high probability "0" bit estimate;

establishing a third threshold (Vopt) to estimate bit values having approximately an equal probability of being a "1" and a "0" bit value;

using forward error correction (FEC) decoding to correct the bit errors; and, sequentially adjusting the first, second, and third thresholds in response to the corrected bit errors.

2. The method of claim 1 wherein establishing the third threshold includes initially setting the third threshold to balance to the number of "1" bit and "0" bit errors.

3. The method of claim 1 wherein establishing the third threshold includes initially setting the third threshold to minimize the total number of bit errors.

4. The method of claim 1 further comprising:

comparing a first bit estimate in the data stream to a second bit value received prior to the first bit;

comparing the first bit estimate to a third bit value received subsequent to the first bit; and, in response to the comparisons, determining the value of the first bit.

5. The method of claim 4 wherein establishing first, second, and third thresholds includes:

distinguishing NRZ data stream inputs below first threshold and above the third threshold as a "0" if both the second and third bits are "1" values, as a "1" if only one of the second and third bits is a "1" value, and as "1" if both the second and third bits are a "0" value; and, distinguishing NRZ data stream inputs above the second threshold and below the third threshold as a "1" if both the second and third bits are a "0" value, as a "0" if only one of the second and third values is a "0" value, and as a "0" if both the second and third bits are a "1" value.

6. The method of claim 5 wherein receiving a non-return to zero (NRZ) data stream input includes receiving NRZ data organized in frames;

wherein using forward error correction (FEC) decoding to correct the bit errors includes summarizing corrected bit errors for each frame; and, wherein iteratively repeating the sequential adjustments of the first, second, and third thresholds in response to the corrected bit errors includes:

simultaneously adjusting the first, second, and third thresholds in response to corrected bit errors for a first set of frames;

independently adjusting the first threshold in response to corrected bit errors for a second set of frames, subsequent to the first set of frames; and, independently adjusting the second threshold in response to corrected bit errors for a third set of frames, subsequent to the first set of frames.

7. The method of claim 1 wherein establishing the first and second thresholds includes:

initially setting the first and second thresholds equal to the third threshold; and, making an initial simultaneous adjustment to the first and second thresholds to minimize the total number of bit errors.

8. The method of claim 7 wherein simultaneously making an initial adjustment to the first and second thresholds includes adjusting the first and second thresholds an equal increment from the third threshold, in opposite directions.

9. The method of claim 8 further comprising:

following the initial simultaneous adjustment of the first and second thresholds, adjusting the first threshold, independent of the second threshold, to minimize the total number of corrected bit errors; and, following the initial simultaneous adjustment of the first and second thresholds, adjusting the second threshold, independent of the first threshold, to minimize the total number of corrected bit errors.

10. The method of claim 9 wherein sequentially adjusting the first, second, and third thresholds in response to the corrected bit errors includes iteratively repeating the sequential adjustments of the first, second, and third thresholds.

11. The method of claim 10 wherein iteratively adjusting the third threshold includes:
adjusting the third threshold in response to an action selected from the group including balancing the number of "1" bit and "0" bit corrected errors and minimizing the total number of bit errors; and,
making equal adjustments to the first and second thresholds.

12. In a communications receiver, a system for determining non-causal channel equalization thresholds, the method comprising:
a multi-threshold decision circuit having an input to accept a non-return to zero (NRZ) data stream encoded with forward error correction (FEC), an input to accept first (V1), second (V0), and third (Vopt) voltage threshold values, and outputs to provide bit estimates responsive to the threshold levels;
a forward error correction (FEC) circuit having an input to receive determined first bit values, the FEC circuit decoding the incoming data stream and corrects bit values in response to the decoding, the FEC circuit having an output to supply a stream of corrected data bits; and,
a threshold generator having an input to receive the determined first bit values and an input to receive corrected data bits from the FEC circuit, the threshold generator having an output to sequentially supply the threshold values to the multi-threshold circuit in response to analyzing the corrected bit errors.

13. The system of claim 12 wherein the threshold generator initially sets the third threshold to balance to the number of "1" bit and "0" bit errors.

14. The system of claim 12 wherein the threshold generator initially sets the third threshold to minimize the total number of bit errors.

15. The system of claim 12 wherein the threshold generator adjusts the first and second thresholds by:
initially setting the first and second thresholds equal to the third threshold; and,
making an initial simultaneous adjustment to the first and second thresholds to minimize the total number of bit errors.

16. The system of claim 15 wherein the threshold generator makes an initial simultaneous adjustment to the first and second thresholds by adjusting the first and second thresholds an equal increment from the third threshold, in opposite directions.

17. The system of claim 16 wherein the threshold generator, following the initial simultaneous adjustment of the first and second thresholds, adjusts the first threshold, independent of the second threshold, to minimize the total number of corrected bit errors, and adjusts the second threshold, independent of the first threshold, to minimize the total number of corrected bit errors.

18. The system of claim 17 wherein the threshold generator iteratively repeats the sequential adjustments of the first, second, and third thresholds.

19. The system of claim 18 wherein the threshold generator iteratively adjusts the third threshold as follows:
adjusting the third threshold in response to an action selected from the group including balancing the number of "1" bit and "0" bit corrected errors and minimizing the total number of bit errors; and,
making equal adjustments to the first and second thresholds.

20. The system of claim 19 further comprising:
a non-causal circuit having inputs to accept bit estimates from the multi-threshold decision circuit, the non-causal circuit comparing a current bit estimate to bit value decisions made across a plurality of clock cycles, the non-causal circuit having an output to supply a first bit value for the current bit estimate determined in response to the bit value comparisons.

21. The system of claim 20 wherein the non-causal circuit includes:
a future decision circuit having inputs connected to the mutli-threshold circuit outputs, the future decision circuit having outputs to supply the current, first bit, estimate and a third bit value;
a present decision circuit having inputs to accept the first bit estimate, the third bit value, and a second bit value, the present decision circuit comparing the first bit estimate to both the second bit value, received prior to the first bit estimate, and the third bit value, received subsequent to the first bit estimate, the present decision circuit having an output to supply the first bit value determined in response to comparing the first bit estimates to the second and third bit values; and,
a past decision circuit having an input to accept the first bit value and an output to supply the second bit value.

22. The system of claim 21 wherein the multi-threshold circuit includes:
a first comparator having an input to accept the NRZ data stream, an input establishing the first threshold (V1), and an output to supply a signal distinguishing when the NRZ data stream input has a high probability of being a "1" bit value;
a second comparator having an input to accept the NRZ data stream, an input establishing the second threshold (V0), and an output to supply a signal distinguishing when the NRZ data stream input has a high probability of being a "0" bit value; and,
a third comparator having an input to accept the NRZ data stream, an input establishing the third threshold (Vopt), and an output to provide a signal when the NRZ data stream input has an approximately equal probability of being a "0" value as a "1" value.

23. The system of claim 22 wherein the future decision circuit supplies a first bit estimate for an NRZ data stream input below the third threshold and above the second threshold;
wherein the present decision circuit, in response, supplies:
a first bit value of "1" if both the second and third bit value are "0" values;
a first bit value of "0" if only one of the second and third bit values is a "0" value; and,
a first bit value of "0" if both the second and third bit values are a "1".

24. The system of claim 23 wherein the future decision circuit supplies a first bit estimate for an NRZ data stream input above the third threshold and below the first threshold;
wherein the present decision circuit, in response, supplies:
a first bit value of "0" if both the second and third bit value are "1" values;
a first bit value of "1" if only one of the second and third bit values is a "1" value; and,
a first bit value of "1" if both the second and third bit values are a "0".

25. The system of claim 24 wherein the multi-threshold circuit receives a non-return to zero (NRZ) data stream with data organized in frames;
    wherein the threshold generator summarizes corrected bit errors for each frame and sequentially adjusts the first, second, and third thresholds in response to the corrected bit errors as follows:
    adjusting the third threshold in response to corrected bit errors for a first set of frames;
    adjusting the first threshold in response to corrected bit errors for a second set of frames, subsequent to the first set of frames; and,
    adjusting the second threshold in response to corrected bit errors for a third set of frames, subsequent to the first set of frames.

26. A communications receiver state machine method for determining non-causal channel equalization thresholds, the method comprising:
    receiving a non-return to zero (NRZ) data stream encoded with forward error correction (FEC);
    setting x=0;
    in State 0, adjusting a third threshold (Vopt) in response to corrected bit errors;
    if x=0, setting a first and second threshold equal to the third threshold;
    in State 1, if x=0, simultaneously adjusting the first threshold, for distinguishing a high probability "1" bit estimate and the second threshold, for distinguishing a high probability "0" bit estimate, to minimize the total number of corrected bit errors;
    in State 2, following State 0, adjusting the first threshold, independent of the second threshold, to minimize the total number of errors;
    in State 3, following State 0, adjusting the second threshold, independent of the first threshold, to minimize the total number of errors; and,
    adding 1 to x and returning to State 0.

27. The method of claim 26 wherein State 0 includes setting a third threshold (Vopt) in response to an action selected from the group including minimizing the total number of corrected bit errors and balancing the number of corrected "1" bit and "0" bit errors.

28. The method of claim 26 wherein in State 1 includes simultaneously adjusting the first threshold and the second threshold an equal increment from the third threshold, in opposite directions.

29. The method of claim 26 wherein State 0 further includes, if x≠0, making adjustments to the first and second threshold equal to adjustments made to the third threshold.

* * * * *